United States Patent
Stuenkel et al.

(10) Patent No.: US 9,859,849 B2
(45) Date of Patent: Jan. 2, 2018

(54) OFF-STATE ISOLATION ENHANCEMENT FOR FEEDBACK AMPLIFIERS

(71) Applicant: BAE SYSTEMS INFORMATION AND ELECTRONIC SYSTEMS INTEGRATION INC., Nashua, NH (US)

(72) Inventors: Mark E. Stuenkel, Hooksett, NH (US); Kevin W. Sliech, Nashua, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 15/216,156

(22) Filed: Jul. 21, 2016

(65) Prior Publication Data

US 2017/0026004 A1 Jan. 26, 2017

Related U.S. Application Data

(60) Provisional application No. 62/196,638, filed on Jul. 24, 2015.

(51) Int. Cl.
*H03F 1/02* (2006.01)
*H03F 1/32* (2006.01)
*H03F 3/45* (2006.01)
*H03F 3/72* (2006.01)

(52) U.S. Cl.
CPC ....... *H03F 1/3211* (2013.01); *H03F 3/45475* (2013.01); *H03F 3/45977* (2013.01); *H03F 3/72* (2013.01); *H03F 2203/45534* (2013.01); *H03F 2203/45562* (2013.01)

(58) Field of Classification Search
CPC .............. H03F 1/34; H03F 3/45; H03F 3/005
USPC ........................................ 330/9, 69, 86, 292
See application file for complete search history.

(56) References Cited

U.S. PATENT DOCUMENTS

| | | | |
|---|---|---|---|
| 5,084,639 A * | 1/1992 | Ribner | H03F 1/303 250/370.09 |
| 6,307,432 B1 | 10/2001 | Tam et al. | |
| 6,507,242 B1 | 1/2003 | Palathol Mana Sivadasan et al. | |
| 7,719,352 B2 | 5/2010 | Kim et al. | |
| 8,026,760 B1 * | 9/2011 | Prasad | H03F 3/005 330/311 |

OTHER PUBLICATIONS

NTUEE Electronics—L.H. Lu. 9-1. Chapter 9 Feedback. Chapter Outline. 9.1 The General Feedback Structure. 9.2 Some Properties of Negative Feedback. Accessed via the World Wide Web at: cc.ee.ntu.edu.tw/~lhlu/eecourses/Electronics2/Electronics_Ch9. pdf. Jul. 6, 2016.

* cited by examiner

*Primary Examiner* — Steven J Mottola
(74) *Attorney, Agent, or Firm* — Sand & Sebolt, LPA

(57) ABSTRACT

A feedback amplifier having an improved feedback network including two cross coupled switches that isolate the amplifier from extraneous undesired electrical signals present in a system or network when the amplifier is turned off (i.e., in an off-state). The cross coupled switches interconnect two feedback paths of a feedback network to enable out-of-phase differential signals to be summed and effectively canceled. Further, the feedback amplifier provides on-stage advantages to enable different amplifier characteristics and parameter to be selectively engaged by turning on or turning off certain feedback networks.

18 Claims, 8 Drawing Sheets

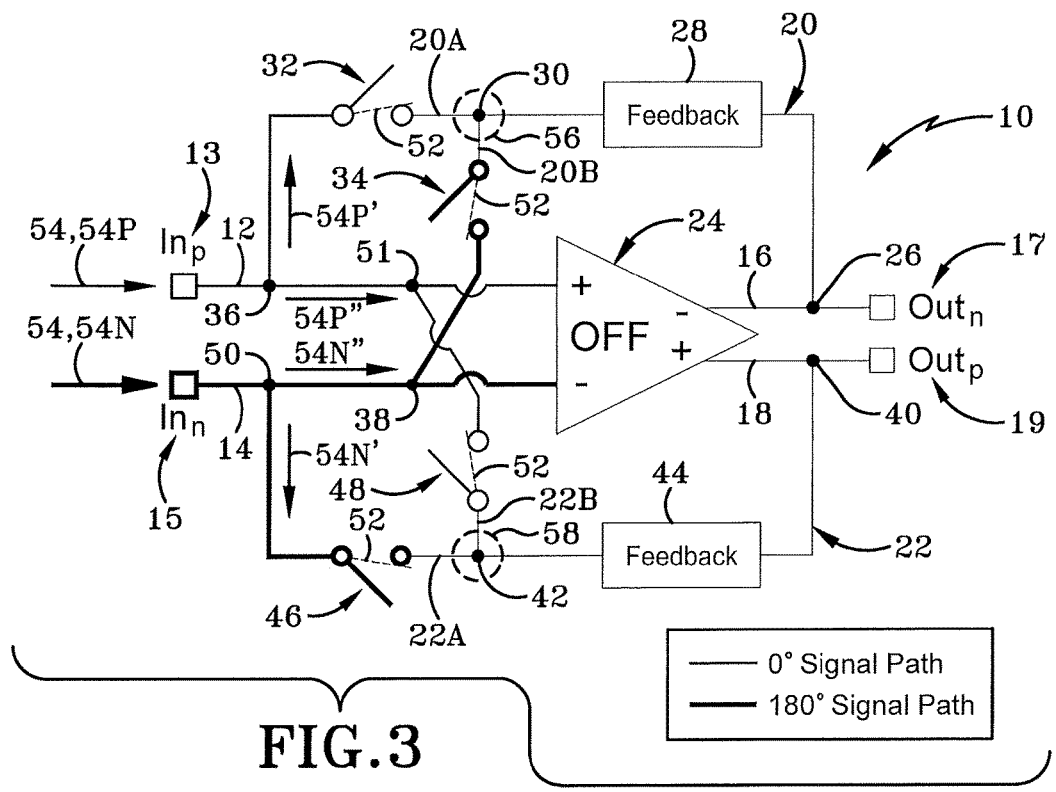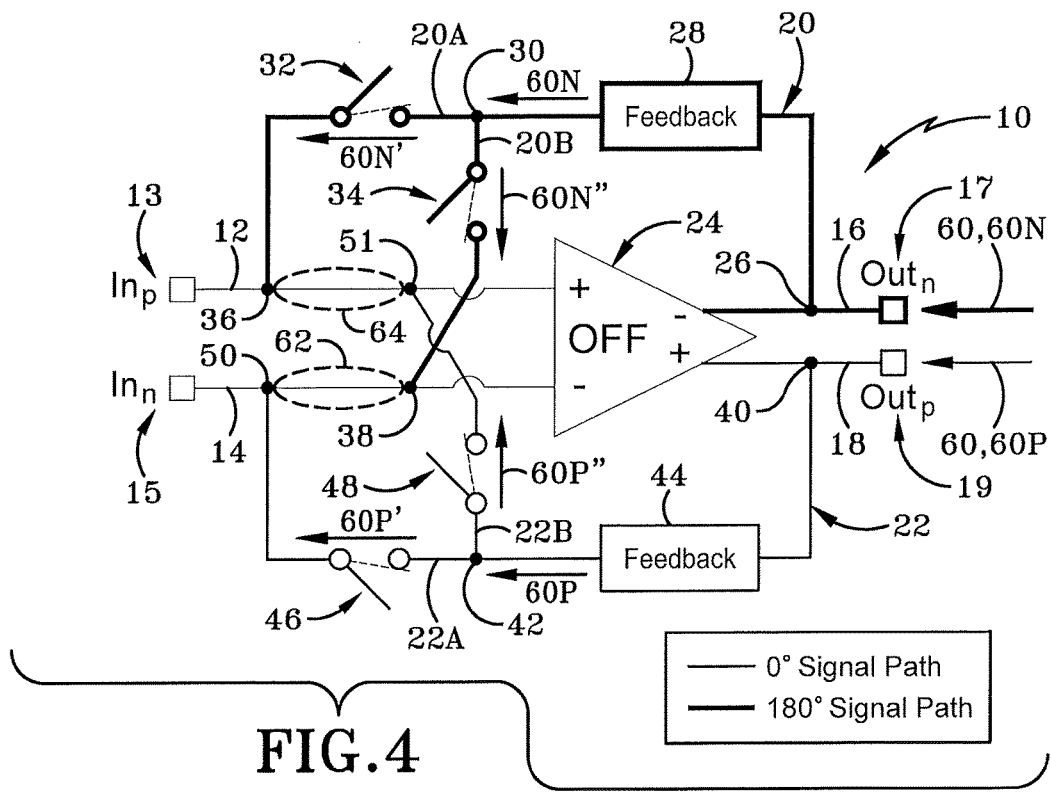

OFF-STATE ISOLATION ENHANCEMENT FOR FEEDBACK AMPLIFIERS

CROSS REFERENCE TO RELATED APPLICATIONS

This application claims the benefit of prior U.S. Provisional Application Ser. No. 62/196,638, filed on Jul. 24, 2015; the disclosure of which is incorporated herein by reference.

STATEMENT OF GOVERNMENT INTEREST

This invention was made with United States Government support under Contract No. HR0011-12-C-0083 awarded by DARPA. The United States Government has certain rights in this invention

BACKGROUND

Technical Field

The present disclosure relates generally to differential feedback amplifiers. More particularly, the present disclosure relates to differential feedback amplifiers having multiple feedback paths. Specifically, the present disclosure relates to feedback paths incorporating cross-coupled switches for differential feedback amplifiers.

Background Information

Data transmission often requires the use of an amplifier to amplify a signal. One exemplary data transmission utilizes differential signaling. Differential signaling is a method for electrically transmitting information using two complementary signals. Differential signaling sends a single electrical signal as a differential pair of signals, each in its own conductor (a positive signal (+) and a negative signal (−)). Differential signaling is frequently used in audio, data transmission, and telephone systems, amongst others. Differential signaling is beneficial because of its resistance to external noise sources.

During the differential signaling process, a differential amplifier is often used to amplify the differential pair of signals. Differential amplifiers are considered beneficial because they can increase immunity to external noise, increase output voltage swing for a given voltage rail, enable low-voltage systems, are easily implemented in integrated circuits, and reduce even-order harmonics, amongst others.

Some differential amplifiers have feedback paths or feedback networks coupling the amplifier's output back to its input. These may be referred to as a differential feedback amplifier. Compared to open loop amplifiers, feedback amplifiers inherently have a comparatively low impedance connection (when compared to the impedance seen from the output to input of a non-feedback amplifier) from their output to input, which is the feedback path. Feedback is very useful because it can stabilize and precisely set the overall performance of a potentially unstable and imprecise high gain, open loop amplifier. However, benefits aside, there are some known drawbacks. Feedback paths may reduce off-state isolation because the feedback path is a connection through which an extraneous and undesired system signal may travel. This feedback path connection provides an electrical pathway around the amplifier circuitry that reduces both the forward and reverse isolation of the circuit compared to conventional differential amplifier topologies that have no feedback path.

In many electrical systems, high isolation is desirable when the amplifier is powered down (off-state), and the feedback paths of a differential feedback amplifier can severely degrade this. To increase off-state isolation, switches can be added in series, but these negatively impact the performance of the amplifier when it is operating normally. Some conventional amplifiers utilizes switches along the feedback path or switches near the feedback systems/circuitry to enable selective control of the feedback signal, but again these negatively impact the performance of the amplifier when it is operating normally (i.e., on-state).

SUMMARY

Issues continue to exist with conventional feedback amplifiers. Namely, a need continues to exist for a differential amplifier having multiple feedback paths that has increased noise immunity, increased off-state isolation, and decreased parasitic capacitance. Further, a method for enhancing the off-state isolation while preserving the on-state performance for differential amplifiers is also therefore needed. The present disclosure addresses these and other issue.

In one aspect, an embodiment of the present disclosure may provide a differential amplifier including a plurality of feedback paths, wherein each one of the plurality of feedback paths includes a cross-coupling switch to connect a voltage output feedback with a voltage input having a similar pole.

In one aspect, an embodiment of the present disclosure may provide a differential inverting amplifier; a first feedback path extending from the negative output towards the positive input; a second feedback path extending from the positive output towards the negative input; wherein the first feedback path includes first and second switches, wherein the second switch cross couples the negative output to the negative input; wherein the second feedback path includes third and fourth switches, wherein the fourth switch cross couples the positive output to the positive input.

In another aspect, an embodiment of the present disclosure may provide series switches and identical cross-coupled switches integrated into a differential amplifier's feedback network. The series switches are turned on during normal operation and off when the differential amplifier is powered off. Further, in a more narrow embodiment, the cross coupled switches may always remain off (i.e., the switch is open). However, other embodiment may include cross coupled switched that are selectively actuated between on/off positions. The position of the switches within the feedback network is such that during normal amplifier operation, its insertion loss becomes part of the feedback and can therefore be designed in without parasitic effect. Further, the cross-coupled switch is positioned at or near the low impedance input of the amplifier, where the effect of its parasitic capacitance on the overall circuit is minimized. When the amplifier is powered off, all the switches are turned off (i.e., opened). The isolation characteristics of these switches now match each other. Equal and opposite currents flow through these off-state switches, cancelling each other out. In the ideal case, this effect completely removes the isolation reducing effect of the feedback.

In one aspect, the invention may provide a feedback amplifier having an improved feedback network including two cross coupled switches that isolate the amplifier from extraneous undesired electrical signals present in a system or network when the amplifier is turned off (i.e., in an off-state). The cross coupled switches interconnect two feedback paths of a feedback network to enable out-of-phase differential signals to be summed and substantially canceled. Further, the feedback amplifier provides on-state advantages to enable different amplifier characteristics and parameter to be selectively engaged by turning on or turning off certain feedback networks.

BRIEF DESCRIPTION OF THE SERVERAL VIEWS OF THE DRAWINGS

A sample embodiment of the disclosure is set forth in the following description, is shown in the drawings and is particularly and distinctly pointed out and set forth in the appended claims. The accompanying drawings, which are fully incorporated herein and constitute a part of the specification, illustrate various examples, methods, and other example embodiments of various aspects of the disclosure. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

FIG. 3 is an operational schematic view of the differential feedback amplifier in an off-state and the cancellation of extraneous undesired signals entering the amplifier input lines.

FIG. 4 is an operational schematic view of the differential feedback amplifier in an off-state and the cancellation of extraneous undesired signals entering the amplifier output lines.

Similar numbers refer to similar parts throughout the drawings.

DETAILED DESCRIPTION

Figure 1:
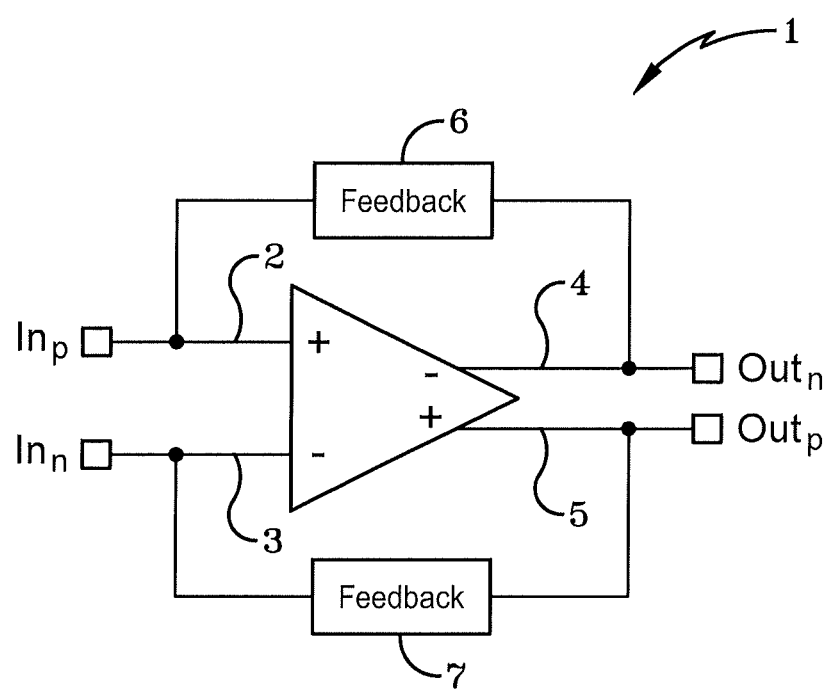
FIG. 1 is a schematic view of a PRIOR ART differential feedback amplifier.

In general, a differential amplifier amplifies the difference between two input voltages. Differential feedback amplifiers include a feedback path that subtracts a fraction of its output from the input, so that negative feedback opposes the original signal. FIG. 1 depicts a conventional differential amplifier having multiple feedback paths. A conventional differential amplifier 1 is shown and includes positive first voltage input 2, a negative second voltage input 3, a negative first voltage output 4, and a positive second voltage output 5. A first feedback path 6 is connected to and enables feedback to flow from negative first voltage output 4 back to positive first voltage input 2. A second feedback path 7 is connected to and enables feedback to flow from positive second voltage output 5 back to negative second voltage input 3. Stated otherwise, in the differential amplifier 1, each respective feedback path starting point at the voltage output is associated with an opposite pole (i.e., opposite sign +/−) voltage input. So, first feedback path 6 begins at negative first voltage output 4 and terminates at positive first voltage input 2. And, second feedback path 7 begins at positive second voltage output 5 and terminates at negative second voltage input 3.

As one having ordinarily skill in the art easily recognizes, amplifiers selectively amplify a desired signal and they may be turned on (i.e., on-state) and turned off (i.e., off-state). In many electrical systems having one or more amplifiers, when an amplifier is turned off, there may be other signals moving in the total electrical system. A typical problem that exists with conventional differential amplifiers is that when the differential amplifier is turned off, other signals may still be present in the system. For the purpose of description, these "other signals" are referred to herein as undesirable signals because they are signals that the amplifier does not desire to amplify or couple between input and output (or vice-versa). The other undesirable signals may carry information related to other portions of the total electrical system and may or may not need to be amplified.

In general, differential amplifiers tend to be not well isolated from the rest of the electrical system and when the amplifier is in an off-state (i.e., turned off), it is possible for an undesirable signal that enters the amplifier output line to follow the feedback path in the reverse direction to essentially shunt or bypass the amplifier circuitry and continue through the electrical system. Further, in an off-state, differential amplifier may permit an undesirable signal to enter amplifier input line and to follow the feedback path in the forward direction to essentially shunt or bypass the amplifier circuitry and continue through the electrical system.

In some applications, it is desirable to have a completely isolated differential amplifier having multiple feedback paths such that this shunting in either the forward or reverse directions by undesirable signals does not occur when the amplifier is in the off-state. Briefly, and in accordance with an aspect of the present disclosure, an embodiment herein may provide an improvement over existing differential amplifiers and the improved differential amplifier may include a cross over switch (also referred to a cross coupled switch) along the feedback paths which enables a differential amplifier to isolate any undesirable differential signal traveling along the feedback path, wherein the undesirable signal cancellation is accomplished by the addition of an out-of-phase signal.

Figure 2:
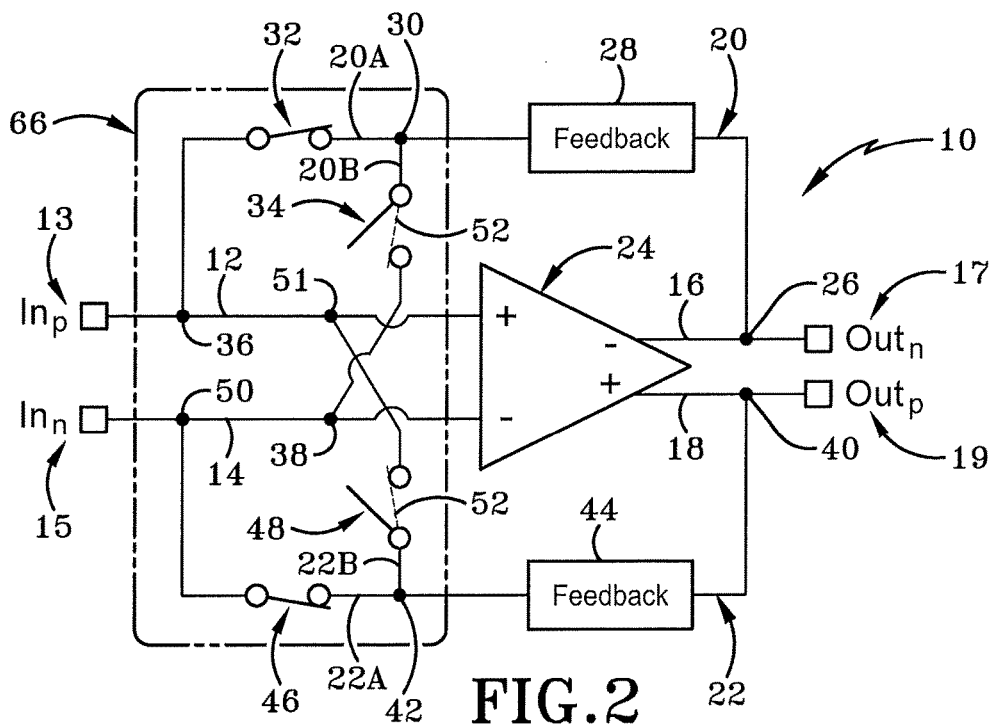
FIG. 2 is a schematic view of a differential feedback amplifier including cross coupled switch in accordance with the present disclosure.

As depicted in FIG. 2, a differential feedback amplifier in accordance with the present disclosure is depicted generally at 10. Differential feedback amplifier 10 includes a positive first voltage line input 12 receiving a positive first input signal 13, a negative second voltage line input 14 receiving a negative second input signal 15, a negative first voltage line output 16 carrying a negative first output signal 17, a positive second voltage line output 18 carrying a second output signal 19. The differential feedback amplifier 10 further includes a first feedback path 20 and a second feedback path 22. The positive first line input 12 corresponds to the negative first line output 16. The negative second line input 14 corresponds to the positive second line output 18.

As one having ordinary skill in the art would understand, differential amplifier circuitry is represented throughout the Figures by way of a sideways triangle and shown generally at 24. The positive first voltage line input 12 is connected to amplifier circuitry 24 and the negative second voltage line input 14 is connected to amplifier circuitry 24. Additionally, the negative first voltage line output 16 is connected to and extends electrically downstream from the amplifier circuitry 24. And, the positive second voltage line output 18 is connected to and extends downstream from the amplifier circuitry 24.

The first feedback path 20 is connected with line output 16 at a node 26. The first feedback path 20 extends from node 26 towards positive first voltage line input 12 upstream from the amplifier circuitry 24. First feedback path may have first feedback circuitry 28 positioned along the first feedback path 20 intermediate node 26 and a node 30. Node 30 may split the first feedback path 20 into a first path first portion 20A and a first path second portion 20B. A first switch 32 is located along first portion 20A of first feedback path 20 and a second switch 34 is located along second portion 20B of first feedback path 20. The first portion 20A of first feedback path 20 connects to positive first voltage line input 12 at node 36. The second portion 20B of first feedback path 20 connects with negative second voltage line input 14 at node 38.

The second feedback path 22 connects with positive second voltage line output 18 at node 40 downstream from the amplifier circuitry 24. The second feedback path extends from node 40 to node 42 and may include second feedback circuitry 44 intermediate nodes 40, 42. At node 42, the second feedback path 22 is split into a second feedback path first portion 22A and a second feedback path second portion 22B. A third switch 46 is positioned along the first portion 22A of second feedback path 22 and a fourth switch 48 is positioned along second portion 22B of second feedback path 22. The first portion 22A of second path 22 extends from node 42 and connects with the negative second voltage line input 14 at node 50. The second portion 22B of second feedback path 22 extends from node 42 and connects with positive first voltage line input 12 at node 51.

Figure 2A:
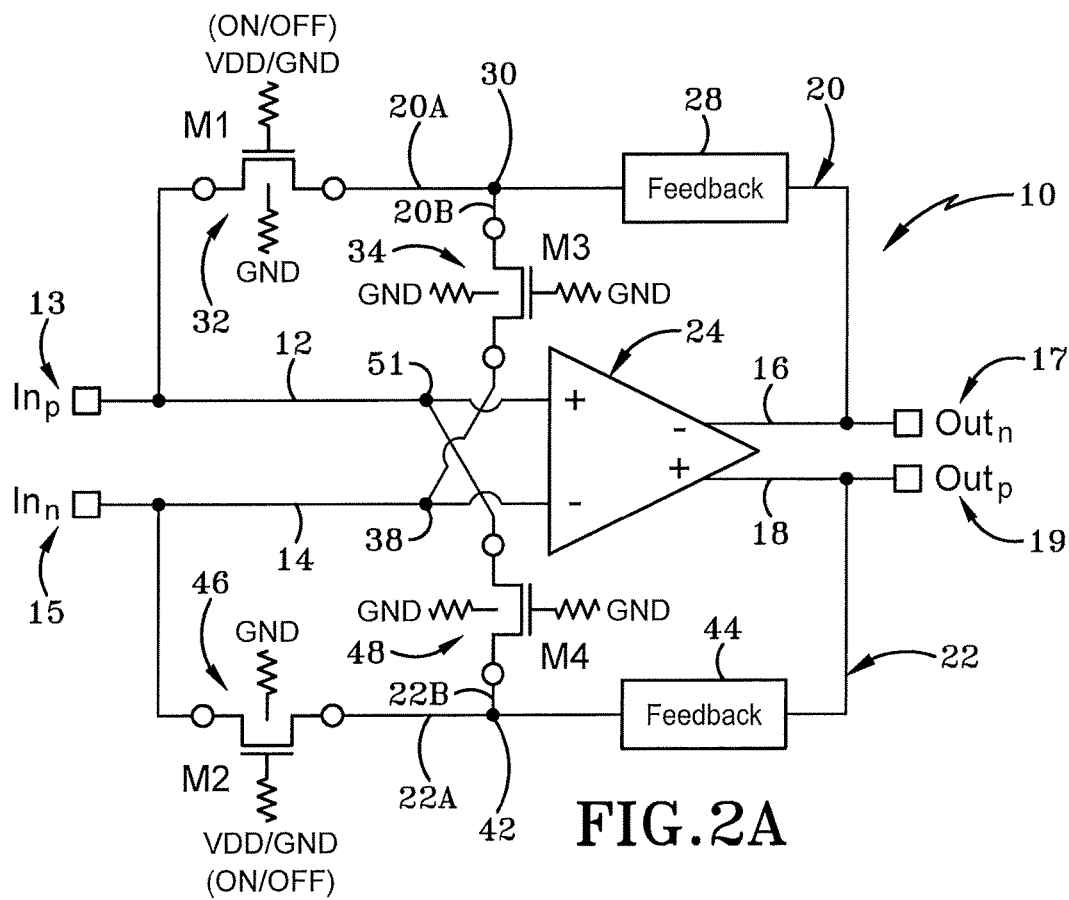
FIG. 2A is a schematic view of the differential feedback amplifier of FIG. 2 detailing the switches according to one embodiment.

FIG. 2A depicts a more detailed schematic of differential feedback amplifier 10 and the first switch 32, the second switch 34, the third switch 46, and the fourth switch 48. In one particular example, each of the switches in differential feedback amplifier 10 is identical to the remaining switches, the purpose of which will be described in greater detail hereinafter. Even further, in one particular embodiment, the switches 32, 34, 46, and 48 may be metal-oxide-semiconductor field-effect transistors (MOSFET) for switching electronic signals. Alternatively, the switches the switches 32, 34, 46, and 48 may be field-effect (FET) transistors. Yet, it should be noted that the switches 32, 34, 46, and 48 could also be any other single pole single throw (SPST) switch.

FIG. 2A depicts the switches 32, 34, 46, and 48 as MOSFET transistors having equal properties. The MOSFET switches 32, 34, 46, and 48 are formed as integrated circuits on semiconductor wafers as one skilled in the art would understand. Further, the switches are selectively controlled by turning them on/off by applying control voltages. The direct current (DC) voltage (VDD) of the MOSFET first and third switches 32 and 46 is the DC voltage that is supplied to each gate of each MOSFET switch to close the switch (i.e., turn the switch ON).

The location of the switches within the respective paths of the overall feedback network is such that during normal amplifier operation, the insertion loss becomes part of the feedback and can therefore be designed in without parasitic effect. Further, the some switches may be positioned at or near the low impedance input of the amplifier where the effect of its parasitic capacitance on the overall circuit is minimized.

As depicted in FIG. 2 and FIG. 2A, the second switch 34 and the fourth switch 48 are considered the "cross-coupling" switches. In one embodiment, the second switch 34 and the fourth switch 48 are always off (i.e., the switch is always open). Hence, in FIG. 2, the second switch 34 and the fourth switch 48 are shown in the open position. And, in FIG. 2A, the second switch 34 and the fourth switch 48 are shown as only connected between two grounds (GND), such that they cannot receive a voltage from VDD to close the switch (i.e., turn the switch on).

It is worth noting that the MOSFET switches 32, 34, 46, 48 are not perfect or ideal switches. As such, at high frequencies, it is possible for a signal to cross the MOSFET switches 32, 34, 46, 48 even when the switch is in the open position. This is referred to a bleeding signal or signal bleeding. The signal bleeding typically occurs because of parasitic capacitance. In each MOSFET switch 32, 34, 46, 48, there is a capacitor from a source operatively connected to a gate and operatively connected from the gate to the drain. So, at a high frequency, the capacitors in the MOSFET switch can pass some current. The MOSFET switch can pass high frequency current through the switch enabling current onto the gate then to the drain. Thus, the signal carried by the current can "sneak around the switch" and create the signal bleeding. The signal bleeding is schematically shown throughout the figures as a dashed line 52 which represents that event when a switch is open, such that the switch 52 can allow signal bleeding at high frequencies.

In the depicted example, the gate and body of each MOSFET transistor are floated to increase switch bandwidth. The body connection of each switch (32, 34, 46, 48) is tied to ground (GND) and the gate connections of the cross coupled switches (34, 48) are also tied to ground (GND) (turning off the devices, therefore opening switches 34 and 48). In normal operation as a feedback amplifier, the gates of first switch 32 and third switch 46 will be tied to VDD (closing switches 32 and 46), where VDD is a higher potential than GND, and large enough to turn on the transistors (turn on switches 32 and 46). When the amplifier is powered down and high isolation is needed between the output and input, the gates of switches 32 and 46 are tied to GND (opening switches 32 and 46). The DC level of the positive input signal 13 and negative input signal 15 is chosen between GND and VDD. This level will affects the on-state impedance of switches 32 and 46, which will be incorporated in the amplifier's feedback.

In one particular implementation, the second switch 34 and the fourth switch 48 are beneficial to cross couple any undesired signal from moving through the amplifier 10 in the off-state. The cross coupling effect cancels out the undesired differential signal by adding an out-of-phase, but otherwise identical differential signal. If the second switch 34 and the fourth switch 48 were not present, and the amplifier only have first switch 32 and third switch 46, then an undesired signal having a high frequency would be able to bleed across (via dashed line 52) along the feedback path, which would result in less overall isolation for the amplifier.

The operation of the off-state differential feedback amplifier 10 to isolate undesired signals is shown in FIG. 3 and FIG. 4. With respect to FIG. 3, an undesirable differential signal is shown generally at 54. The undesirable differential signal 54 includes a positive portion 54P and a negative portion 54N. The positive portion 54P and negative portion 54N are identical signals but are out-of-phase relative to each other by 180 degrees (i.e., having the opposite pole +/−). Throughout the Figures, the signal pathway of the positive portion 54P may be shown as a "0° signal path", which is represented schematically by a first line weight, and the signal pathway of the negative portion 54N is shown as a "180° signal path", which is represented schematically by a bolded second line weight.

In FIG. 3, the amplifier circuitry 24 is in the off-state and is labeled "OFF." Amplifier circuitry 24 provides sufficient signal isolation in the off-state, however because of the two feedback paths 20, 22 (described above), an undesired signal 54 in the system may still try to shunt (i.e., bypass) the amplifier circuitry 24 and continue through the rest of the electrical system. FIG. 3 depicts the cancellation by way of out-of-phase addition of an undesired differential signal to prevent such a scenario from occurring. When the amplifier circuitry 24 is in the off-state, the switches 32, 34, 46, 48 located along the feedback paths 20, 22 are open. But, because the switches 32, 34, 46, 48 may be MOSFET transistors, there may still be a bleed path (see dashed line 52), which requires that the differential signal needs canceled to prevent the undesired signal from contaminating the electrical system.

With continued reference to FIG. 3, an example of off-state forward direction isolation is achieved. The term forward direction refers to an undesired signal entering the amplifier input lines when the amplifier is turned off. The positive portion 54P of undesired signal 54 may enter the positive first voltage line input 12 and be split at node 36 into two sub-portions 54P' and 54P'" which represent the 0° signal path. The first sub-portion 54P' travels along the first portion 20A of feedback path 20 and the second sub-portion 54P'" travels along the second portion 22B of second feedback path 22. As described above, if the first sub-portion 54P' has a sufficient high frequency, it may bleed across the first switch 32 even when it is open. Additionally the second sub portion 54P'" would bleed across the fourth switch 48 that is cross coupled to the second feedback path 22. The negative portion 54N of undesired differential signal 54 may enter the negative second voltage line input 14 and be split at node 50 into two sub-portions 54N' and 54N". The first sub-portion 54N' travels along the first portion 22A of second feedback path 22 and the second sub-portion 54N" travels along the second portion 20B of first feedback path 22. Again, if the first sub-portion 54N' has a sufficient high frequency, it may bleed across the third switch 46 when it is open. Additionally the second sub portion 54N" would bleed across the second switch 34 that is cross coupled to the first feedback path 20.

In the event that the sub-portions of the undesired signal bleed across the switches 32, 34, 46, 48, the cross coupled switches effect cancellation of the undesired signal 54. The first sub-portion 54P' would bleed through the first switch 32 and travel towards node 30. The second sub-portion 54N" would bleed through the second switch 34 and travel towards node 30. Because the first sub-portion 54P' and second sub-portion 54N" are out-of-phase relative to each other, they cancel each other out at a first cancellation region or location which is generally represented as a dashed circle 56 when they are added together (i.e., out-of-phase summation). The first sub-portion 54N' would bleed through the third switch 46 and travel towards node 42. The second sub-portion 54P'" would bleed through the fourth switch 48 and travel towards node 42. Because the first sub-portion 54N' and second sub-portion 54P'" are out-of-phase relative to each other, they cancel each other out at a second cancellation location which is generally represented as a dashed circle 58. Thus, amplifier 10 is enabled to isolate undesired signals in its off-state and prevent the undesired differential signals from shunting through the feedback paths.

FIG. 4 provides an operational example of off-state reverse direction isolation. The term reverse direction refers to an undesired signal 60 entering the amplifier output lines when the amplifier is turned off. The positive portion 60P of undesired signal 60 may enter the positive second voltage line output 18 and pass through second feedback circuitry 44 and be split at node 42 into two sub-portions 60P' and 60P'" which represent the 0° signal path. The first sub-portion 60P' travels along the first portion 22A of second feedback path 22 and the second sub-portion 60P'" travels along the second portion 22B. As described above, if the first sub-portion 60P' has a sufficient high frequency, it may bleed across the third switch 46 when the switch is open. Additionally the second sub portion 60P'" would bleed across the fourth switch 48 that is cross coupled to the first feedback path 20. The negative portion 60N of undesired differential signal 60 may enter the negative first voltage line output 16 and pass through first feedback circuitry 28 and be split at node 30 into two sub-portions 60N' and 60N". The first sub-portion 60N' travels along the first portion 20A of first feedback path 20 and the second sub-portion 60N" travels along the second portion 20B. Again, if the first sub-portion 60N' has a sufficient high frequency, it may bleed across the first switch 32 even when it is open. Additionally the second sub portion 60N" would bleed across the second switch 34 that is cross coupled to the second feedback path 22.

In the event that the sub-portions of the undesired signal 60 bleed across the switches 32, 34, 46, 48, the cross coupled switches effect cancellation of the undesired signal 60. The first sub-portion 60P' would bleed through the third switch 46 and travel towards node 50. The second sub-portion 60N" would bleed through the second switch 34 and travel towards node 38. Because the first sub-portion 60P' and second sub-portion 60N" are out-of-phase relative to each other, they cancel each other out at a first cancellation location which is generally represented as a dashed oval 62. The first sub-portion 60N' would bleed through the first switch 32 and travel towards node 36. The second sub-portion 60P'" would bleed through the fourth switch 48 and travel towards node 51. Because the first sub-portion 60N' and second sub-portion 60P'" are out-of-phase relative to each other, they cancel each other out at a second cancellation location which is generally represented as a dashed oval 64. Thus, amplifier 10 is enabled to isolate undesired signals in its off-state and prevent the undesired differential signals from shunting through the feedback paths.

Figure 5:
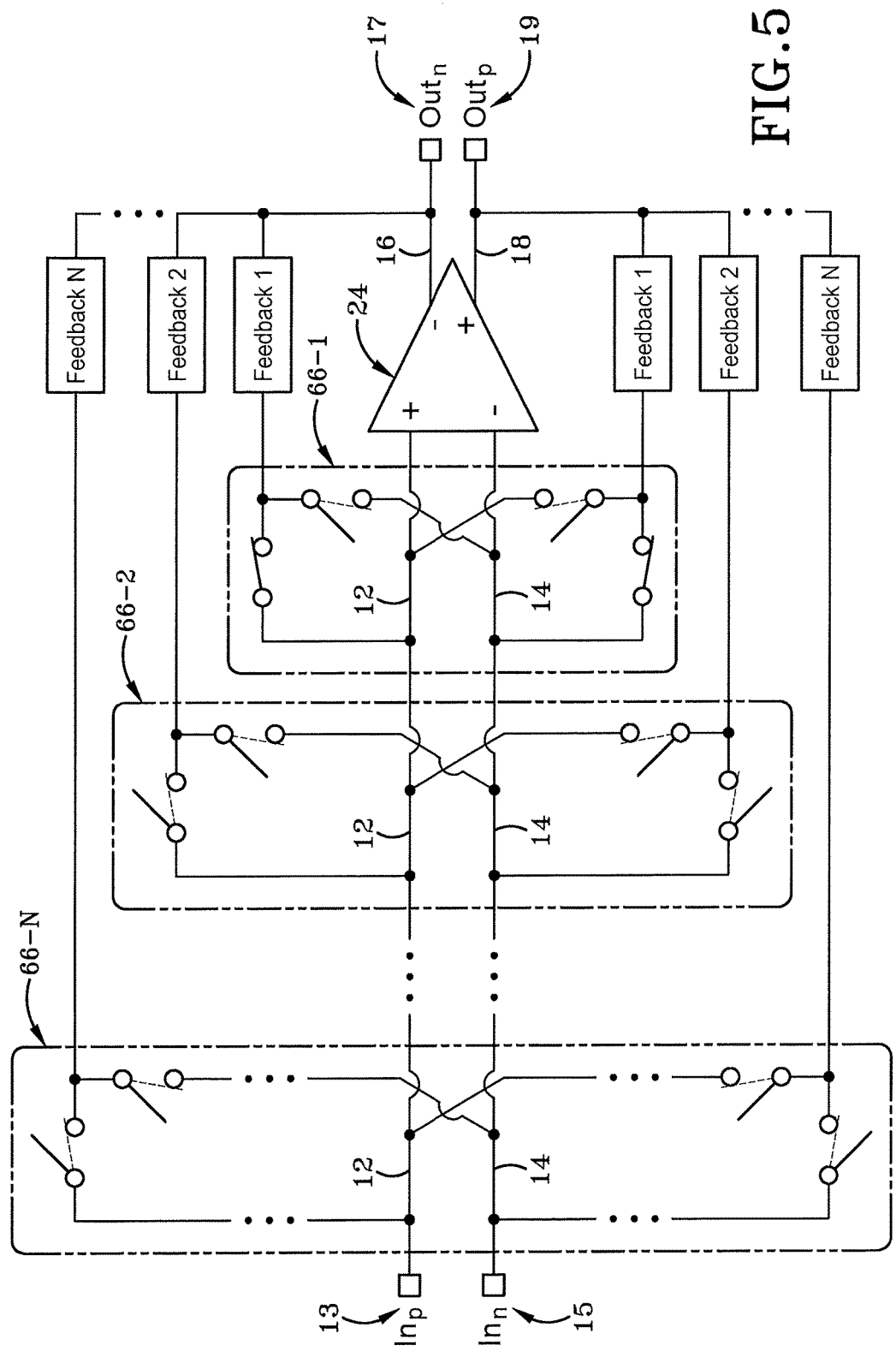
FIG. 5 is a schematic view of the differential feedback amplifier in conjunction with multiple feedback networks.
Figure 6:
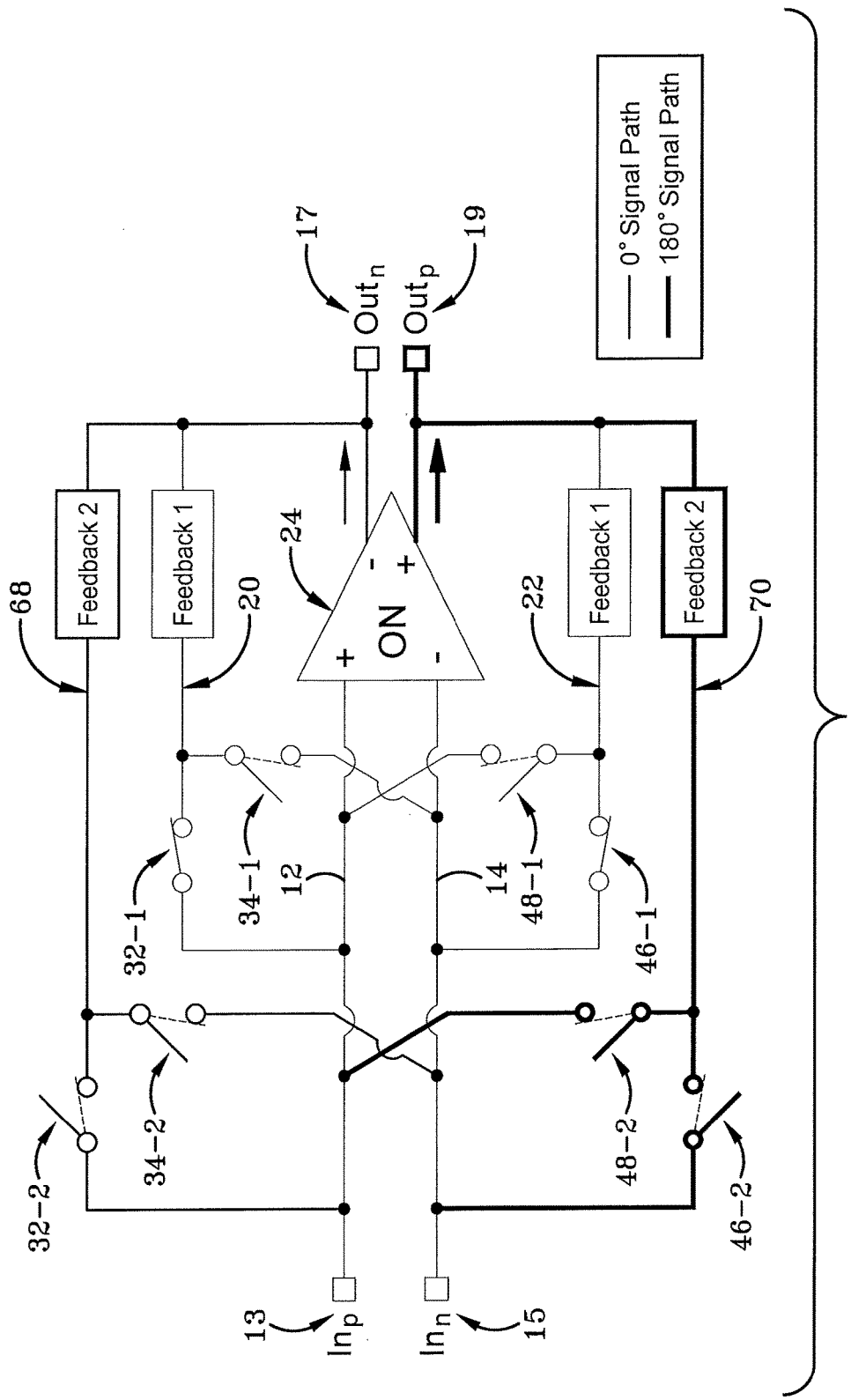
FIG. 6 is a schematic view of the differential feedback amplifier having multiple feedback networks and selective canceling one of the feedback paths in a feedback direction to control amplifier parameters and characteristics.
Figure 7:
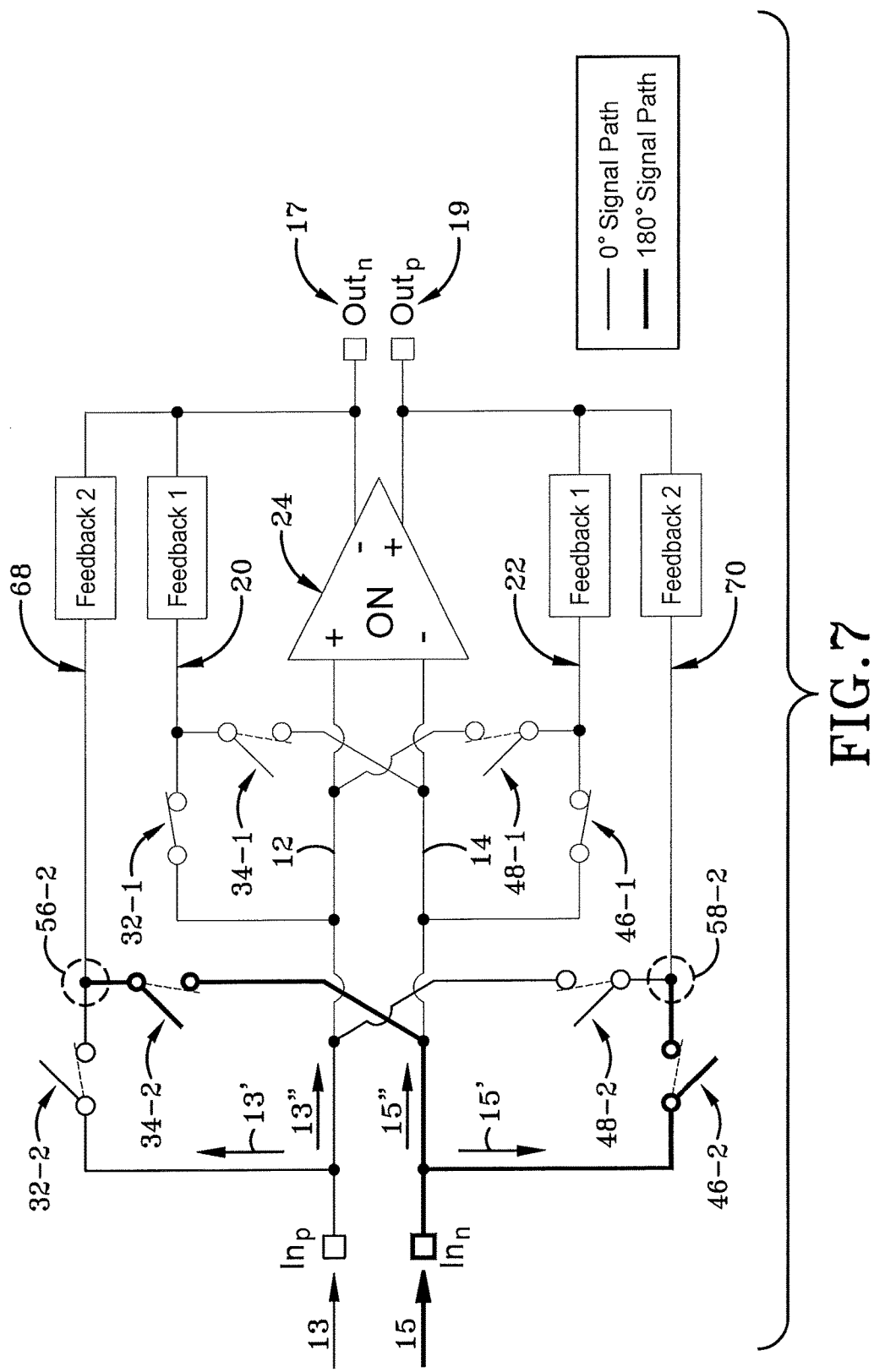
FIG. 7 is a schematic view of the differential feedback amplifier having multiple feedback networks and selectively canceling one of the feedback paths in a feed-through direction to control amplifier parameters and characteristics.

The on-state operation of amplifier 10 is shown schematically in FIG. 5, FIG. 6, and FIG. 7.

As depicted in FIG. 5, amplifier 10 may include a plurality or multiple feedback networks. Amplifier 10 allows switching between multiple feedback networks to change the closed loop characteristics of the system, without directly loading the amplifier's input or reducing the differential off-state isolation of the circuit.

With continued reference to FIG. 5, a first feedback network, labeled FEEDBACK 1, having two paths includes four switches, wherein two switches are configured in the cross coupled relationship as described above. These are collectively referred to as a first feedback enhancement region 66-1. A second feedback network, labeled FEEDBACK 2, having two paths includes four switches, wherein two switches are configured in the cross coupled relationship as described above. These are collectively referred to as a second feedback enhancement region 66-2. A N-th number feedback network (wherein N is any positive integer), labeled FEEDBACK N, having two paths includes four switches, wherein two switches are configured in the cross coupled relationship as described above. These are collectively referred to as a N-th feedback enhancement region 66-N. The multiple feedback networks enable selective setting of different amplifier parameters, which will be described hereinbelow.

FIG. 6 depicts the on-state operation of amplifier 10 including the selectively activated feedback networks. Amplifier 10 includes a first feedback network (FEEDBACK 1) formed from first feedback path 20 and second feedback path 22. Amplifier 10 may also include a second feedback network (FEEDBACK 2) including a third feedback path 68 and a fourth feedback path 70.

An operator can selectively control the operation of the amplifier 10 depending on which feedback network is selected. As such, feedback amplifier 10 can be considered a variable function feedback amplifier. For example, the first feedback network could be associated with signal amplification that has high gain and low bandwidth. And, the second feedback network could be associated with the signal amplification that has low gain and high bandwidth. Thus, depending on the operator's objective and use for the amplifier 10, the various switches in the enhancement regions 66 could be opened or closed to selectively route signals through either FEEDBACK 1 or FEEDBACK 2 (or also FEEDBACK N, if applicable).

With continued reference to FIG. 6, on-state amplifier circuitry 24 is shown as "ON" providing feedback cancellation to accomplish certain selective amplifier parameters or characteristics. An incoming differential signal is input through the input line, wherein the positive first voltage line input 12 carries positive signal 13 and the negative second voltage line input 14 carries negative signal 15. Amplifier circuitry 24 amplifies the differential signal and outputs the amplified signals 17, 19 along outputs 16, 18, respectively. The amplifier 10 of FIG. 6 is shown operating with the design characteristics of the first feedback network. The first switch 32-1 and the third switch 46-1 are closed. This enables feedback signals to travel from the output lines along the first and second feedback paths 20, 22. The switches associated with the second feedback network, which are shown as 32-2, 34-2, 46-2, and 48-2 are all open. Thus, any feedback signal traveling through the second feedback network (FEEDBACK 2) would be canceled by the cross coupled switches, namely second switch 34-2 and fourth switch 48-2. The cancellation near the input lines 12, 14 eliminates unwanted feedback signals. Thus, the example of FIG. 6 could represent where an operator desired to have a feedback amplifier that provides signal amplification that has high gain and low bandwidth.

If an operator desired to alter the parameters of amplifier 10, the first feedback network could be turned off by opening all of the switches 32-1, 34-1, 46-1, and 48-1. Then, the operator could make the second feedback network (FEEDBACK 2) operational by closing the first switch 32-2 and closing the third switch 46-2. The selective opening and closing of the various switches depicted herein may be performed by switch logic or a state machine, or another type of controller. Ordinarily the switch logic or state machine is external to amplifier 10.

FIG. 7 depicts on-state amplifier circuitry 24 of feedback amplifier 10 accomplishing feed through cancellation. In this instance, positive input signal 13 is split into two signal sub-portions 13' and 13". Signal sub-portion 13' travels towards open first switch 32-2 and if the frequency of signal sub-portion 13' is sufficiently high, then it will bleed across open first switch 32-2. Signal sub-portion 13" travels towards open fourth switch 48-2 (which cross couples to the positive second feedback path 70). The negative input signal 15 is split into two signal sub-portions 15' and 15". Signal sub-portion 15' travels towards open third switch 46-2 and if the frequency of signal sub-portion 15' is sufficiently high, then it will bleed across open third switch 46-2. Signal sub-portion 15" travels towards open second switch 34-2 (which cross couples to the negative first feedback path 68). The positive sub-portion 13' and negative sub-portion 15" cancel each other at cancellation zone 56-2. The positive sub-portion 13" and the negative sub-portion 15' cancel each other at cancellation zone 58-2. Since the switches associated with the second feedback network, (i.e., switches 32-2, 34-2, 46-2, and 48-2) are all open, any input signal traveling forward through the second feedback network (FEEDBACK 2) would be canceled by the cross coupled switches, namely second switch 34-2 and fourth switch 48-2, at cancellation zones 56-2 and 58-2. Thus, the example of FIG. 7 could represent where an operator desired to have a feedback amplifier that provides signal amplification that has high gain and low bandwidth. Furthermore, since the amplifier depicted in FIG. 6 and FIG. 7 can selectively change amplifier characteristics and parameters as described above, the amplifier may be considered a multi-mode feedback amplifier.

In one particular embodiment, the cross coupled switches, which are the second switch 34 and the fourth switch 48 are always open. This enable the crossing switches to form a coupling path. The amplifier 10 may be used for a variety of uses, however, it is contemplated that amplifier will be especially beneficial when implemented into radar technology, receivers, transmitters, transceivers, and the like.

In accordance with the present disclosure, amplifier 10 provides the following non-exhaustive advantages over the prior art. With respect to switches in series with the amplifier, various different types of switch topologies with varying degrees of off-state isolation and on-state loss can be used in series with a feedback amplifier to improve isolation when the amplifier is off, and can work well for this purpose. However, during normal operation, these switches add loss in series with the amplifier, directly adding to the noise figure and reducing gain. The present disclosure integrates the switch as part of the feedback network and the series loss is no longer parasitic; the series loss is used as a desired part of the feedback. With respect to switches in series with the feedback network (i.e., the first switch 32 and the third switch 46), there is a similarity to our system but without the cross-coupled switches, limiting the isolation to the isolation of the series switches. Without the cancellation effect provided by the cross-coupled switches, the isolation reducing effect of the feedback cannot be completely removed. Those skilled in the art will also appreciate that this isolation enhancement technique can be used in any circuit that has differential feedback, not just an amplifier. Due to the cross coupling current cancellation at the input, this technique also allows multiple networks to be switched in and out of a circuits feedback loop, changing the closed loop characteristics of the circuit, e.g. gain and bandwidth, without directly loading the amplifiers input or reducing the differential off-state isolation of the circuit.

FIG. 8A through FIG. 8E depicts and exemplary method of operation for an embodiment of the differential feedback amplifier in accordance with the present disclosure. The method is shown generally at 800. Providing a differential amplifier including a first feedback path having first and second switches and a second feedback path having third and fourth switches, wherein the second switch and the fourth switch cross couple the first and second feedback paths to differentially opposing inputs is shown generally at 802. Isolating the differential amplifier in an off-state from an undesired extraneous differential signal traveling along the first feedback path and the second feedback path is shown generally at 804.

Figure 8C:
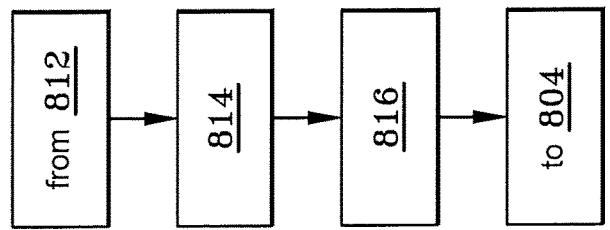
FIG. 8C is a flow chart depicting the operation of the differential feedback amplifier stemming from FIG. 8B.
Figure 8B:
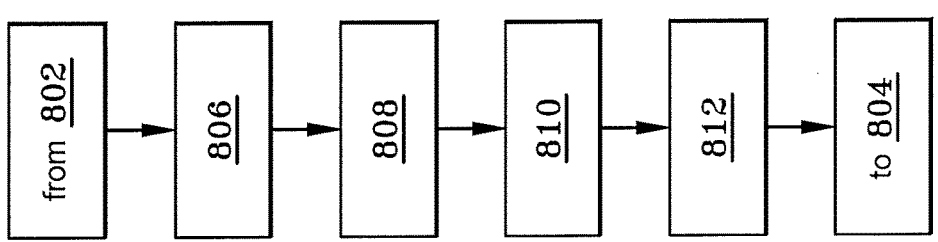
FIG. 8B is a flow chart depicting the operation of the differential feedback amplifier stemming from FIG. 8A.
Figure 8A:
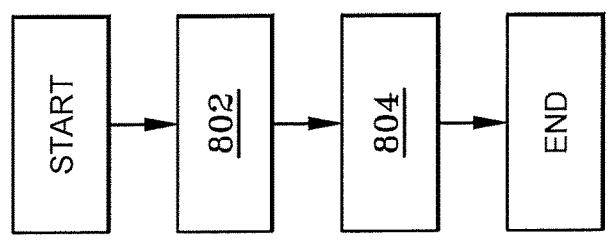
FIG. 8A is a flow chart depicting exemplary operation of one embodiment of the differential feedback amplifier.

FIG. 8B depicts additional steps of the method 800 stemming from FIG. 8A. Namely, opening the first switch, the second switch, the third switch, and the fourth switch is shown generally at 806. Receiving the undesired extraneous differential signal including a positive signal portion along first line input and including a negative signal portion along a second line input is shown generally at 808. Directing a sub-portion of the positive signal towards the first switch and directing a sub-portion of the negative signal toward the second switch is shown generally at 810. And, cancelling the undesired signal at a first node downstream from the first and second switch through out-of-phase summation is shown generally at 812. FIG. 8C depicts additional steps of the method 800. Namely, directing a sub-portion of the negative signal towards the third switch and directing a sub-portion of the positive signal toward the fourth switch is shown generally at 814. And, cancelling the undesired signal at a second node downstream from the third switch and fourth switch through out-of-phase summation is shown generally at 816.

Figure 8D:
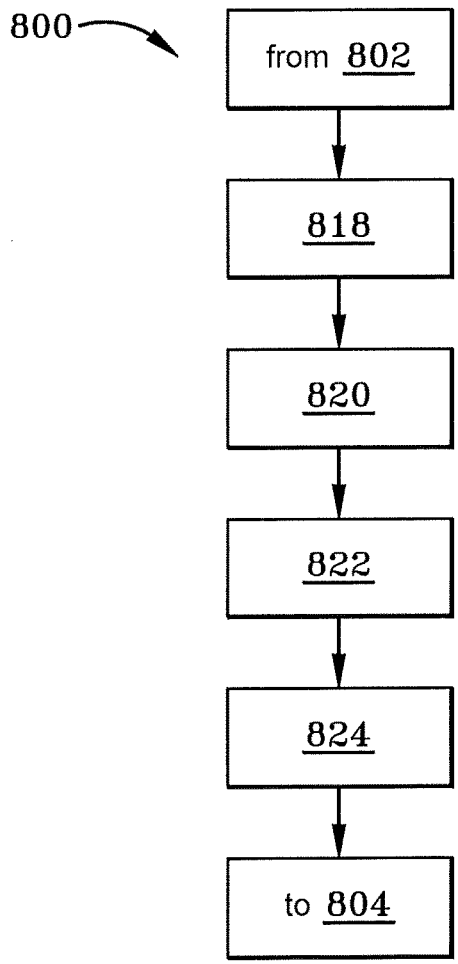
FIG. 8D is a flow chart depicting the operation of the differential feedback amplifier stemming from FIG. 8A.
Figure 8E:
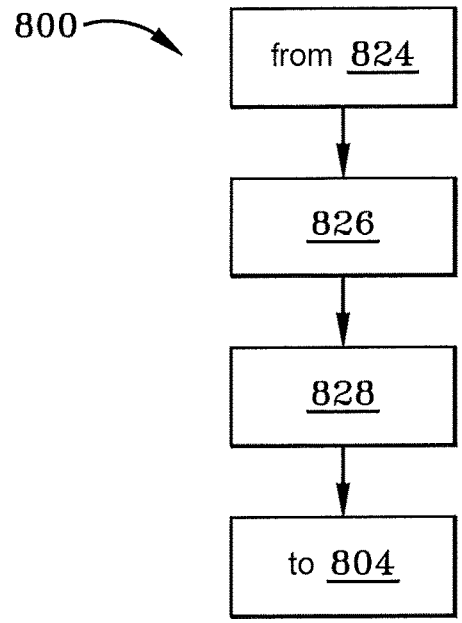
FIG. 8E is a flow chart depicting the operation of the differential feedback amplifier stemming from FIG. 8D.

FIG. 8D depicts additional steps of method 800 stemming from FIG. 8A. Namely, opening the first switch, the second switch, the third switch, and the fourth switch is shown generally at 818. Receiving the undesired extraneous differential signal including a negative signal portion along first line output and including a positive signal portion along a second line output is shown generally at 820. Directing a sub-portion of the negative signal towards the second switch and directing a sub-portion of the positive signal toward the third switch is shown generally at 822. And, cancelling the undesired signal at a first cancellation region 62 through out-of-phase summation is shown generally at 824. FIG. 8E depicts additional steps of the method 800. Namely, directing a sub-portion of the negative signal towards the first switch and directing a sub-portion of the positive signal toward the fourth switch is shown generally at 826. And, cancelling the undesired signal at a second cancellation region 64 through out-of-phase summation is shown generally at 828.

While the present disclosure has been described in connection with the exemplary embodiments of the various figures, it is to be understood that other similar embodiments may be used or modifications and additions may be made to the described embodiment for performing the same function of the present disclosure without deviating therefrom. Therefore, the present disclosure should not be limited to any single embodiment, but rather construed in breadth and scope in accordance with the recitation of the appended claims.

The term "cross couples" or "cross coupling" used herein refers to the movement across the switch along the feedback path that connects the output line having a pole with input line that is associated with the same pole (i.e., similar sign −/− or +/+). A switch along one feedback path cross couples (i.e. connects) the negative first voltage outlet to the negative second voltage input and another switch cross along another feedback path couples (i.e. connects) the positive second voltage output to the positive first voltage input. The term "cross" is used because conventional feedback paths in differential amplifier connect the voltage output back to an opposite pole voltage input (i.e., out of phase—opposing sign +/− or −/+; See PRIOR ART FIG. 1), thus cross coupling crosses-over the conventional feedback path to connect the voltage output back to a similar pole voltage input.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration set out herein are an example and the disclosure is not limited to the exact details shown or described.

The invention claimed is:

1. A differential feedback amplifier comprising:
   a positive first line input corresponding to a negative first line output;
   a negative second line input corresponding to a positive second line output;
   a first feedback path extending from the first line output towards the first line input;
   a second feedback path extending from the second line output towards the second line input;
   wherein the first feedback path includes a first switch and a second switch, wherein the first switch couples the first feedback path to the positive first line input and the second switch cross couples the first feedback path to the negative second line input;
   wherein the second feedback path includes a third switch and a fourth switch, wherein the third switch couples the second feedback path to the negative second line input and the fourth switch cross couples the second feedback path to the positive first line input; and
   wherein at least one of the first switch, the second switch, the third switch, and the fourth switch is installed proximate a low impedance amplifier input to minimize parasitic capacitance.

2. The differential feedback amplifier of claim 1 further comprising:
   open and closed positions associated with each of the first switch, the second switch, the third switch, and the fourth switch;
   wherein an extraneous and undesired signal is isolated depending on the open and closed position of each switch.

3. The differential feedback amplifier of claim 2, wherein each of the first switch, the second switch, the third switch, and the fourth switch are formed from a transistor.

4. The differential feedback amplifier of claim 2, wherein when the first switch, the second switch, the third switch, and the fourth switch are in the open position, and the extraneous and undesired signal has a high frequency, the extraneous and undesired signal bleeds across the open first switch, the open second switch, the open third switch, and the open fourth switch.

5. The differential feedback amplifier of claim 4, wherein the second switch and the fourth switch are always in the open position.

6. The differential feedback amplifier of claim 1, wherein when the amplifier is in an on-state, an insertion loss of the switches is incorporated into feedback sent through the first and second feedback paths.

7. The differential feedback amplifier of claim 6 that is substantially free from parasitic capacitance effect.

8. A method for operating a differential amplifier comprising:
providing a differential amplifier including a first feedback path having first and second switches and a second feedback path having third and fourth switches, wherein the second switch and the fourth switch cross couple the first and second feedback paths to differentially opposing inputs;
isolating the differential amplifier in an off-state from an undesired extraneous differential signal traveling along the first feedback path and the second feedback path, wherein isolating the differential amplifier further includes:
opening the first switch, the second switch, the third switch, and the fourth switch;
receiving the undesired extraneous differential signal including a positive signal portion along first line input and including a negative signal portion along a second line input;
directing a sub-portion of the positive signal towards the first switch and directing a sub-portion of the negative signal toward the second switch; and
cancelling the undesired signal at a first node downstream from the first and second switch through out-of-phase summation.

9. The method of claim 8, further comprising:
directing a sub-portion of the negative signal towards the third switch and directing a sub-portion of the positive signal toward the fourth switch;
cancelling the undesired signal at a second node downstream from the third switch and fourth switch through out-of-phase summation.

10. The method of claim 8, wherein isolating the differential amplifier further comprises:
opening the first switch, the second switch, the third switch, and the fourth switch;
receiving the undesired extraneous differential signal including a negative signal portion along first line output and including a positive signal portion along a second line output;
directing a sub-portion of the negative signal towards the second switch and directing a sub-portion of the positive signal toward the third switch; and
cancelling the undesired signal at a first cancellation region through out-of-phase summation.

11. The method of claim 10, further comprising:
directing a sub-portion of the negative signal towards the first switch and directing a sub-portion of the positive signal toward the fourth switch; and
cancelling the undesired signal at a second cancellation region through out-of-phase summation.

12. A differential amplifier comprising a plurality of feedback paths, wherein each one of the plurality of feedback paths includes a cross-coupling switch connecting a voltage output feedback with a voltage input having a similar pole to effect off-state amplifier isolation from extraneous undesired signals moving in an electrical system and to effect on-state amplifier characteristics and performance changes, wherein at least one of the cross-coupling switches is installed proximate a low impedance amplifier input to minimize parasitic capacitance.

13. The differential amplifier of claim 12, wherein each cross-coupling switch is a field-effect transistor.

14. The differential amplifier of claim 13, further comprising a ground only connection to each cross-coupling switch effecting an always open switch.

15. The differential amplifier of claim 14, wherein each cross-coupling switch is a metal-oxide-semiconductor field-effect transistor (MOSFET).

16. The differential amplifier of claim 12, further comprising switches in the feedback path that are not cross coupled, wherein on-state multi-mode amplification is selective engaged by opening and closing the switches in the feedback path that are not cross coupled.

17. The differential amplifier of claim 12, having off-state total isolation from the undesired signals.

18. A differential feedback amplifier comprising:
a positive first line input corresponding to a negative first line output;
a negative second line input corresponding to a positive second line output;
a first feedback path extending from the first line output towards the first line input;
a second feedback path extending from the second line output towards the second line input;
wherein the first feedback path includes a first switch and a second switch, wherein the first switch couples the first feedback path to the positive first line input and the second switch cross couples the first feedback path to the negative second line input;
wherein the second feedback path includes a third switch and a fourth switch, wherein the third switch couples the second feedback path to the negative second line input and the fourth switch cross couples the second feedback path to the positive first line input; and
wherein the second switch and the fourth switch are always in the open position.

* * * * *